US012250889B2

(12) United States Patent
Philip et al.

(10) Patent No.: US 12,250,889 B2
(45) Date of Patent: Mar. 11, 2025

(54) PHASE CHANGE MEMORY CELL WITH DOUBLE ACTIVE VOLUME

(71) Applicant: INTERNATIONAL BUSINESS MACHINES CORPORATION, Armonk, NY (US)

(72) Inventors: Timothy Mathew Philip, Albany, NY (US); Jin Ping Han, Yorktown Heights, NY (US); Kevin W. Brew, Niskayuna, NY (US); Ching-Tzu Chen, Ossining, NY (US); Injo Ok, Loudonville, NY (US)

(73) Assignee: International Business Machines Corporation, Armonk, NY (US)

( * ) Notice: Subject to any disclaimer, the term of this patent is extended or adjusted under 35 U.S.C. 154(b) by 507 days.

(21) Appl. No.: 17/653,143

(22) Filed: Mar. 2, 2022

(65) Prior Publication Data

US 2023/0284541 A1   Sep. 7, 2023

(51) Int. Cl.
  *H10N 70/20*   (2023.01)
  *G11C 13/00*   (2006.01)
  *H10N 70/00*   (2023.01)

(52) U.S. Cl.
  CPC ......... *H10N 70/231* (2023.02); *G11C 13/004* (2013.01); *H10N 70/021* (2023.02);
  (Continued)

(58) Field of Classification Search
  CPC .. H10N 70/231; H10N 70/828; H10N 70/021; H10N 70/826; H10N 70/8616;
  (Continued)

(56) References Cited

U.S. PATENT DOCUMENTS 7,560,721 B1   7/2009   Breitwisch
7,755,074 B2   7/2010   Kostylev
(Continued)

FOREIGN PATENT DOCUMENTS

TW    I720952 B      3/2021
WO    2006072842 A1  7/2006
WO    2020263360 A1  12/2020

OTHER PUBLICATIONS

Invitation to Pay Additional Fees and, Where Applicable, Protest Fee, Date of mailing May 26, 2023, International application No. PCT/EP2023/054340, 9 pages.
(Continued)

*Primary Examiner* — Victor A Mandala
(74) *Attorney, Agent, or Firm* — L. Jeffrey Kelly

(57) ABSTRACT

A first phase change material layer vertically aligned above a bottom electrode, a dielectric layer vertically aligned above the first phase change material layer, a second phase change material layer vertically aligned above the dielectric layer, an inner electrode physically and electrically connected to the first phase change material layer and the second phase change material layer, the inner electrode surrounded by the dielectric layer, a top electrode vertically aligned above the second phase change material layer. A first phase change material layer vertically aligned above a bottom electrode, a filament layer vertically aligned above the first phase change material layer, a second phase change material layer vertically aligned above the filament layer, an inner break in the filament layer connecting the first phase change material layer and the second phase change material layer, a top electrode vertically aligned above the second phase change material layer.

21 Claims, 17 Drawing Sheets

(52) U.S. Cl.
CPC ....... H10N 70/826 (2023.02); H10N 70/8616 (2023.02); *G11C 13/0004* (2013.01); *G11C 2013/0045* (2013.01)

(58) Field of Classification Search
CPC ............. H10N 70/821; H10N 70/8413; H10N 70/8828; H10N 70/011; G11C 13/004; G11C 13/0004; G11C 2013/0045; H10B 63/10
See application file for complete search history.

(56) References Cited

U.S. PATENT DOCUMENTS

| | | | |
|---|---|---|---|
| 7,923,712 | B2 | 4/2011 | Arnold |
| 8,471,236 | B2 | 6/2013 | Breitwisch |
| 9,082,964 | B2 | 7/2015 | Hong |
| 2005/0111247 | A1 | 5/2005 | Takaura |
| 2006/0039192 | A1 | 2/2006 | Ha |
| 2007/0108431 | A1 | 5/2007 | Chen |
| 2008/0023685 | A1 | 1/2008 | Czubatyj |
| 2008/0144355 | A1* | 6/2008 | Boeve ................. H10N 70/826 438/467 |
| 2008/0248632 | A1 | 10/2008 | Youn |
| 2009/0045386 | A1* | 2/2009 | Chen ................... H10N 70/826 365/163 |
| 2009/0189139 | A1 | 7/2009 | Schrott |
| 2010/0055830 | A1* | 3/2010 | Chen ................... H10N 70/884 438/102 |
| 2016/0233420 | A1 | 8/2016 | Troyan |
| 2019/0115392 | A1* | 4/2019 | Bruce ................... H10B 63/84 |
| 2019/0165264 | A1 | 5/2019 | Wu |
| 2020/0013951 | A1 | 1/2020 | Wu |
| 2022/0165945 | A1* | 5/2022 | Navarro ............. G11C 13/0004 |
| 2023/0081603 | A1* | 3/2023 | Wu ...................... H10N 70/063 257/4 |
| 2023/0337557 | A1* | 10/2023 | Manfrini ............... H10B 63/30 |
| 2024/0081159 | A1* | 3/2024 | Chen ................... H10N 70/823 |

OTHER PUBLICATIONS

Notification of Transmittal of the International Search Report and the Written Opinion of the International Searching Authority, or the Declaration, Date of mailing Jul. 17, 2023, International application No. PCT/EP2023/054340, 18 pages.

Hayat, "A Study of the Scaling and Advanced Functionality Potential of Phase Change Memory Devices", Nov. 2016, Submitted to the University of Exeter as a thesis for the degree of Doctor of Philosophy (PhD) in Engineering, 214 pages.

Pending U.S. Appl. No. 17/118,664, filed Dec. 11, 2020, entitled: "Phase Change Memory Cell With Ovonic Threshold Switch", 25 pages.

Taiwan Patent Office, "Second office action," Jan. 9, 2025, 9 Pages, TW Application No. 112101489.

* cited by examiner

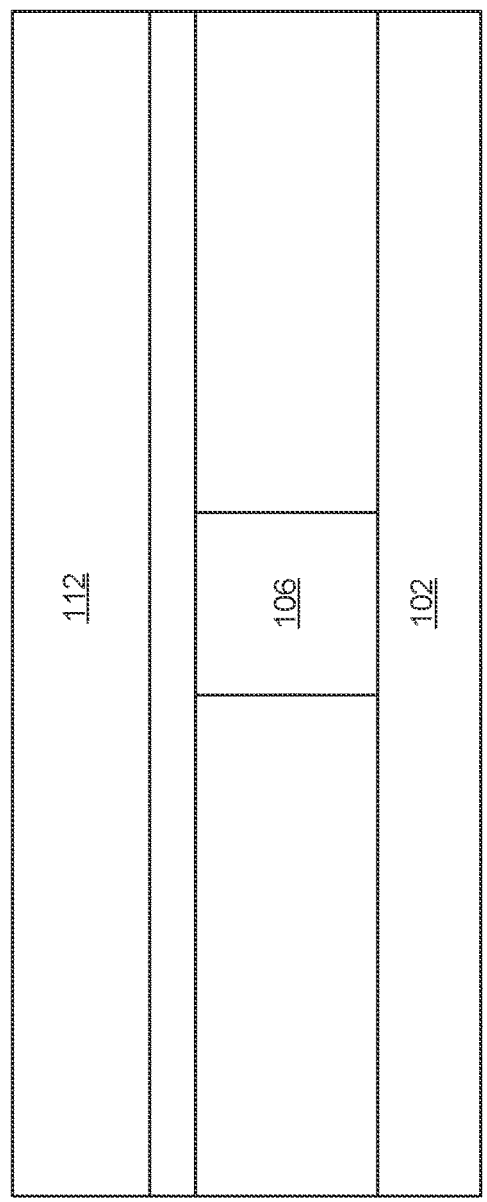
Figure 2

PHASE CHANGE MEMORY CELL WITH DOUBLE ACTIVE VOLUME

BACKGROUND

The present invention relates generally to a phase change memory cell, and more particularly, to a phase change memory cell with double active volume.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

SUMMARY

According to an embodiment of the present invention, a structure is provided. The structure may include a first phase change material layer vertically aligned above a bottom electrode, a dielectric layer vertically aligned above the first phase change material layer, a second phase change material layer vertically aligned above the dielectric layer, an inner electrode physically and electrically connected to the first phase change material layer and the second phase change material layer, the inner electrode surrounded by the dielectric layer and a top electrode vertically aligned above the second phase change material layer.

A further embodiment where a lateral diameter of the inner electrode is less than a lateral diameter of the bottom electrode. An embodiment further including a first projection liner vertically aligned between the first phase change material layer and the dielectric layer and a second projection liner vertically aligned between the second phase change material layer and the dielectric layer. An embodiment further including a first thermal barrier layer vertically aligned between the first phase change material layer and the dielectric layer and a first thermal barrier layer vertically aligned between the second phase change material layer and the dielectric layer. An embodiment further including a first adhesion layer vertically aligned between the first phase change material layer and the dielectric layer and a first adhesion layer vertically aligned between the second phase change material layer and the dielectric layer.

According to an embodiment of the present invention, a structure is provided. The structure including a first phase change material layer aligned above a first portion of an inner electrode, a first outer electrode vertically aligned above the first phase change material layer, a second phase change material layer aligned above a second portion of the inner electrode, a second outer electrode vertically aligned above the second phase change material layer and a dielectric layer vertically physically and electrically separating the first phase change material layer and the first outer electrode from the second phase change material layer and the second outer electrode.

According to an embodiment of the present invention, a structure is provided. The structure including a first phase change material layer aligned above a first outer electrode, an inner electrode physically and electrically connected between the first phase change material layer and a second phase change material layer, a second outer electrode vertically aligned above the second phase change material layer and a dielectric layer vertically physically and electrically separating the first phase change material layer and the first outer electrode from the second phase change material layer and the second outer electrode.

According to an embodiment of the present invention, a structure is provided. The structure including a first phase change material layer vertically aligned above a bottom electrode, a filament layer vertically aligned above the first phase change material layer, a second phase change material layer vertically aligned above the filament layer, an inner break in the filament layer connecting the first phase change material layer and the second phase change material layer and a top electrode vertically aligned above the second phase change material layer.

A further embodiment where the filament layer comprises a high-k dielectric. An embodiment where the filament layer comprises a mixed ionic electronic conducting filament. An embodiment further including a first liner vertically aligned between the first phase change material layer and the filament layer and a second liner vertically aligned between the second phase change material layer and the filament layer. An embodiment where the first liner and the second liner are each a projection layer. An embodiment where the first liner and the second liner are each a thermal barrier layer. An embodiment where the first liner and the second liner are each an adhesion layer. An embodiment further including a first liner vertically aligned between the first phase change material layer and the bottom electrode and a second liner vertically aligned between the second phase change material layer and the top electrode. An embodiment where the first liner and the second liner are each a projection layer. An embodiment where the first liner and the second liner are each a thermal barrier layer. An embodiment where the first liner and the second liner are each an adhesion layer.

According to an embodiment of the present invention, a method is provided. The method may include forming a first phase change material layer above a bottom electrode, forming a dielectric layer above the first phase change material layer, forming an inner electrode in the dielectric layer, forming a second phase change material layer above the dielectric layer, where the inner electrode physically and electrically is connected to both the first phase change material layer and the second phase change material layer, forming a top electrode above the second phase change material layer.

A further embodiment including providing a high voltage pulse to the dielectric layer to form the inner electrode, where the dielectric layer comprises a dielectric constant greater than or equal to 5.0. An embodiment including resetting the structure to an amorphous stage by applying a current to the inner electrode. An embodiment including reading a memory state of the structure by applying a voltage between the bottom electrode and the top electrode.

BRIEF DESCRIPTION OF THE DRAWINGS

The following detailed description, given by way of example and not intend to limit the invention solely thereto, will best be appreciated in conjunction with the accompanying drawings, in which:

FIG. 2 illustrates a cross-sectional view of the semiconductor structure illustrating depositing a first outer electrode and forming a first phase change material layer, according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
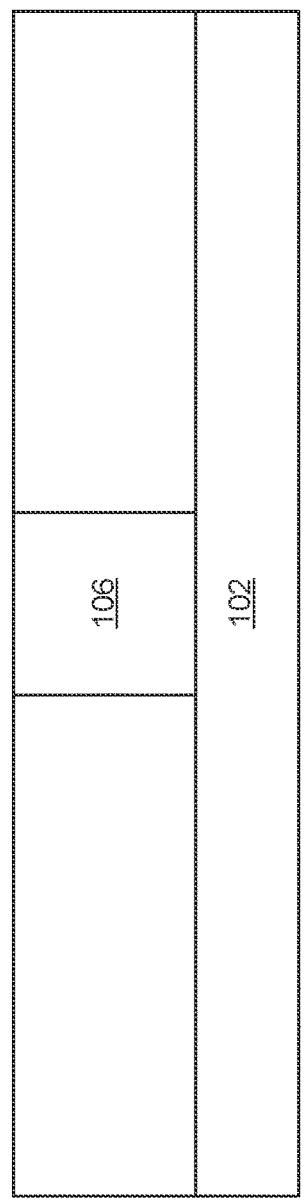
FIG. 1 illustrates a cross-sectional view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a phase change memory cell, and more particularly, to a phase change memory cell with double active volume.

As stated above, a typical configuration of a phase change memory cell may include a phase change material arranged between, and coupled to, at least two electrodes. A bottom contact and a top contact may each be connected to one of the two electrodes. The phase change material may be used as a phase change memory which stores data by controlling a resistive state of the phase change material. A low resistive state has the phase change material fully crystallized. A high resistive state has amorphized phase change material. The phase change material may be amorphized by supplying energy to the phase change material such as, for example, electrical energy, thermal energy, any other suitable form of energy or combination thereof that may effectuate a desired phase transition. For example, a current pulse may be applied to either of the two electrodes, from either the top or bottom contact, which may be referred to as a heater electrode. For more than two memory states, such as for analog computing, an amount of amorphous volume may be controlled for a continuum of resistance states which can be programmed.

As the phase change material has energy supplied to change to an amorphized state, the portions of the phase change material which become amorphized typically become amorphized starting where the current pulse is applied and spreading out in a 'mushroom shape'. This results in a semicircle or mushroom shape portion of amorphized phase change material and a remaining portion of crystalized phase change material. This memory cell may be referred to as a mushroom cell. Mushroom cells exhibit read bias polarity asymmetry. Measuring a resistance of a mushroom cell may vary dependent upon a polarity of a read voltage applied resulting in different values. The polarity dependence of the mushroom cell limits a speed, power efficiency and accuracy of neuromorphic computing using phase change memory cells. Neuromorphic computing or neuromorphic engineering is used in artificial intelligence.

Additionally, a bottom electrode or heater of the phase change material needs to be made as small as possible with good reproductivity, to allow for a high current flux and to minimize an overall programming current needed to reset the phase change material to the high resistance amorphized state.

A physically symmetric mushroom cell device is proposed to address these problems. The physically symmetric mushroom cell device has little to no polarity dependence due to its symmetric amorphous configuration, has reduced programming current due to improved thermal confinement from phase change material both above and below the heater electrode, and has lower power consumption during analog computing due to higher SET/RESET resistance of structure to change to and from an amorphized and crystalized state. Both the SET and the RESET resistance can be up to double of that of a single active region device. These resistances can be tuned by modifying the thickness of the phase change material layer.

In this invention, a first phase change material layer may be formed, a dielectric layer with an inner electrode may be formed and a second phase change material layer may be formed. The additional layers of the inner electrode and the second phase change material layer provide a physically symmetric mushroom cell device with reduced programming current due to improved thermal confinement from phase change material both above and below the inner electrode, and has lower power consumption during analog computing. The inner electrode may be referred to as a heater electrode. The physically symmetric mushroom cell device will enable bi-directional read operation, such that the individual cell can be read in either direction, saving time and power to read the device.

In an embodiment, a first liner is formed between the first phase change material layer and the dielectric layer and inner electrode layer, and a second liner is formed between the dielectric layer and inner electrode layer and the second phase change material layer.

In an embodiment, a filament layer may be formed between the first and second phase change material layers. A portion of the filament layer may be broken down, forming a contact similar to the inner electrode, between the first and second phase change material layers.

In an embodiment, a first liner is formed between the first phase change material layer and the filament layer, and a second liner is formed between the filament layer and the second phase change material layer.

In an embodiment, a first liner is formed between the first phase change material layer and the first outer electrode, and a second liner is formed between the second outer electrode and the second phase change material layer.

The liner may include one or more layers and may include a thermal barrier layer, an adhesion layer and a projection liner which reduces programming current and drift.

The inner electrode and the filament layer may each be considered an atomically thin heater which helps to reduce programming current of an individual cell. The integration of the inner electrode or the filament layer helps to provide a symmetric read of the individual cell which is independent of a read polarity. In artificial intelligence applications, a resistance of the device corresponds to a weight that can be positive or negative. The positive component of the weight on the device may be labeled G+ and the negative component of the weight on the device may be labeled G−. If there is no asymmetry in the device, both devices can be read simultaneously by applying a positive voltage to one device, a negative voltage to the other device, and allowing the currents to cancel. This can increase the speed and energy efficiency of the architecture.

The inner electrode and the filament layer may provide a simpler integration which avoids anomalous heater mask by using a filament instead of a patterned heater. When a heater via is normally patterned in a dielectric, there is some gouge into the material below. In this structure, that could damage the bottom PCM layer. If instead of patterning a heater, the dielectric can be subjected to a large electric field that can cause dielectric breakdown and form a conductive filament through the dielectric. This effectively creates a very narrow heater without needing to explicitly pattern a via.

The inner electrode and the filament layer each provide a self alignment feature when forming these layers, providing for ease of implementing these manufacturing steps.

A method of forming a phase change memory cell with a double active volume is described in detail below by referring to the accompanying drawings in FIGS. 1-17, in accordance with an illustrative embodiment.

Referring now to FIG. 1, a semiconductor structure (hereinafter "structure") 100 is shown at an intermediate step of fabrication, according to an embodiment. The structure 100 may include a stack of layers formed on top of a substrate 102 and subsequently patterned into individual cells. The structure 100 includes, for example, a substrate 102, a dielectric layer 104, and a bottom contact 106.

The substrate 102 may be a silicon substrate with connections and structures, such as, for example, transistors and isolations built on it. The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick.

The dielectric layer 104 can be deposited across the top of the structure 100 in a blanket layer using any known deposition techniques, such as, for example, chemical vapor deposition, atomic layer deposition, physical layer deposition, or some combination thereof. The dielectric layer 104 may include materials, such as, for example, an oxide, a nitride, or some combination thereof. In an embodiment, the dielectric layer 104 may include an oxide, such as, silicon oxide. In an alternate embodiment, the dielectric layer 104 may include a nitride, such as, silicon nitride. A chemical mechanical planarization technique may optionally be used to polish the dielectric layer 104 and provide a substantially smooth and uniform surface in preparation for subsequent processing techniques.

The conductive material layer of the bottom contact 106 is deposited within a trench (not shown) formed in the dielectric layer 104. The bottom contact 106 may be formed from a conductive material layer, such as, for example, copper, tungsten, cobalt, or aluminum. The conductive material layer may be deposited using typical deposition techniques, for example, atomic layer deposition, molecular layer deposition, and chemical vapor deposition. In an embodiment, the bottom contact 106 may have a thickness ranging from about 10 nm to about 100 nm, although a thickness less than 10 nm and greater than 100 nm may be acceptable. A chemical mechanical polishing (CMP) technique may be used to remove excess material and polish upper surfaces of the structure 100, providing a uniform horizontal surface.

Referring now to FIG. 2, the structure 100 is shown according to an embodiment. A first outer electrode 110 and a first phase change material layer 112 may be formed.

The conductive material layer of the first outer electrode 110 may be blanket deposited on the structure 100, on the bottom contact 106 and on the dielectric layer 104. The first outer electrode 110 may be formed as described for the bottom contact 106. The first outer electrode 110 may be alternatively deposited in a trench on the structure 100.

The first phase change material layer 112 may be blanket deposited on the structure 100, and directly on a top surface of the conductive material layer of the first outer electrode 110. Conventional deposition processes, such as electroplating, electroless plating, chemical vapor deposition, physical vapor deposition, or a combination of methods, can be used to deposit the first phase change material layer 112 on the first outer electrode 110, According to embodiments of the present invention, the first phase change material layer 112 may be formed from a mixture of gallium (Ga) and antimony (Sb) and at least one of tellurium (Te), silicon (Si), germanium (Ge), arsenic (As), selenium (Se), indium (In), tin (Sn), bismuth (Bi), silver (Ag), gold (Au), and antimony (Sb). It is to be appreciated that the preceding list is merely illustrative and, thus, other elements can also be used to form the first phase change material layer 112, while maintaining the spirit of the present principles disclosed herein. In an embodiment, the first phase change material layer 112 may be made of a chalcogenide alloy such as germanium-antimony-tellurium (GST). According to another embodiment, the first phase change material layer 112 may also be made of a transition metal oxide having multiple resistance states. For example, the first phase change material layer 112 may be made of at least one material selected from the group consisting of NiO, $TiO_2$, HfO, $Nb_2O_5$, ZnO, $WO_3$, and CoO or GST ($Ge_2Sb_2Te_5$) or PCMO ($Pr_xCa1-xMnO_3$). In yet another embodiment, the first phase change material layer 112 may be a chemical compound including one or more elements selected from the group consisting of sulfur (S), selenium (Se), tellurium (Te), arsenic (As), antimony (Sb), germanium (Ge), tin (Sn), indium (In), and silver (Ag). In an embodiment, the first phase change material layer 112 may have a thickness ranging from about 10 nm to about 100 nm, although a thickness less than 10 nm and greater than 100 nm may be acceptable.

A chemical mechanical polishing (CMP) technique may be used to remove excess material and polish upper surfaces of the structure 100, providing a uniform horizontal surface.

Figure 3:
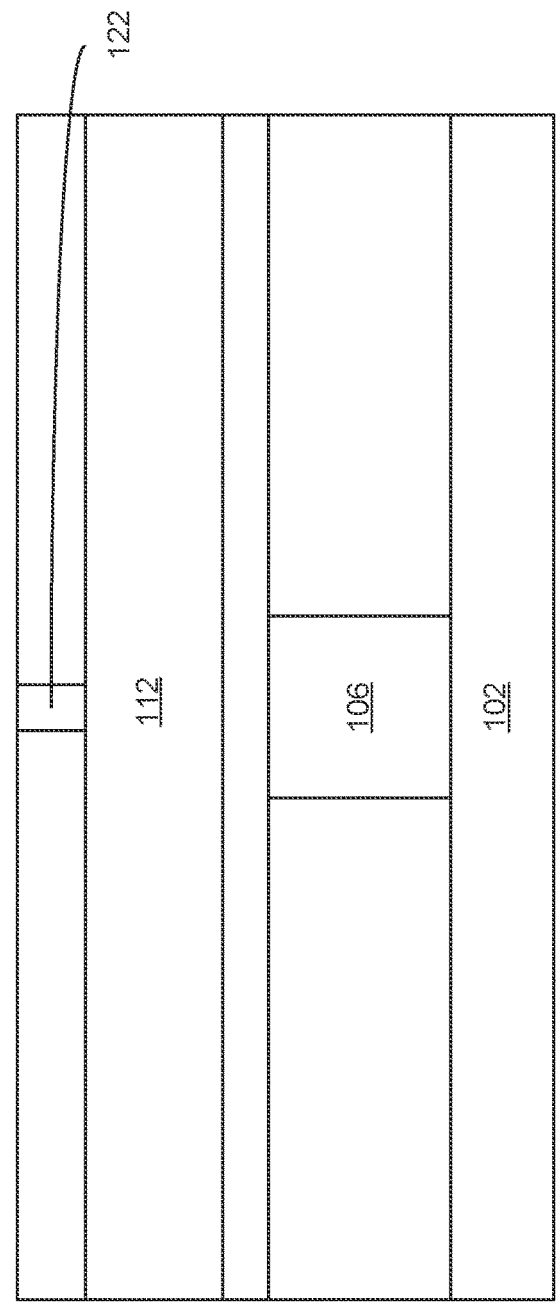
FIG. 3 illustrates a cross-sectional view of the semiconductor structure illustrating patterning an inner electrode, according to an exemplary embodiment.

Referring now to FIG. 3, the structure 100 is shown according to an embodiment. A dielectric layer 120 and an inner electrode 122 may be formed.

The dielectric layer 120 may be formed on the first phase change material layer 112 and formed as described for the dielectric layer 104. An opening (not shown) may be formed in the dielectric layer 120, exposing a portion of an upper surface of the first phase change material layer 112. The opening may be formed by methods known in the arts. The inner electrode 122 may be formed in the opening (not shown). The inner electrode 122 may be formed as described for the first outer electrode 110. The inner electrode 122 may be referred to as a heater element.

A chemical mechanical polishing (CMP) technique may be used to remove excess material and polish upper surfaces of the structure 100, providing a uniform horizontal surface of the inner electrode 122 and the dielectric layer 120.

Figure 4:
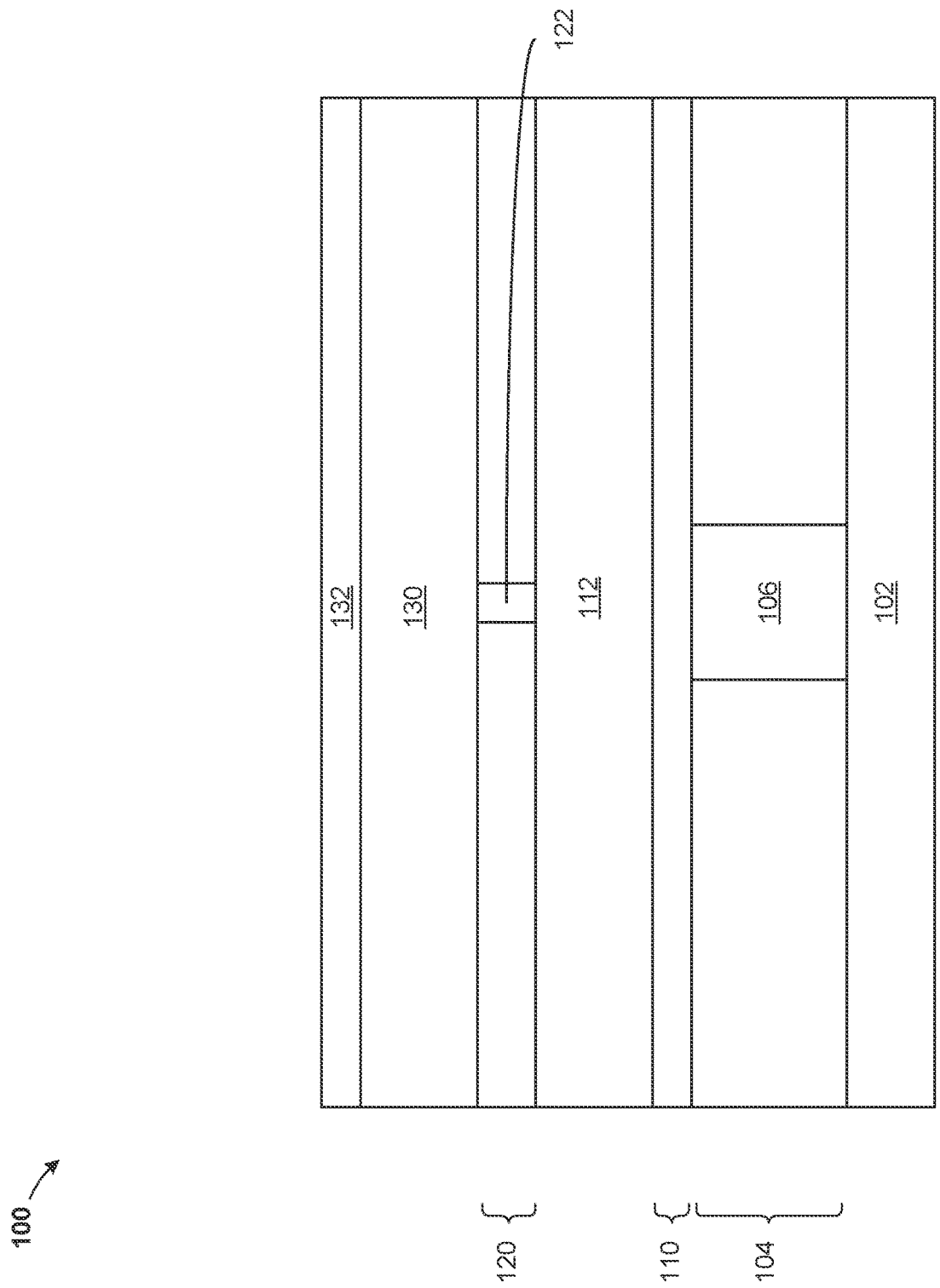
FIG. 4 illustrates a cross-sectional view of the semiconductor structure illustrating forming a second phase change material layer and forming a second outer electrode, according to an exemplary embodiment.

Referring now to FIG. 4, the structure 100 is shown according to an embodiment. A second phase change material layer 130 and a second outer electrode 110 may be formed.

The second phase change material layer 130 may be formed as described for the first phase change material layer 112 on the inner electrode 122 and the dielectric layer 120. The second outer electrode 132 may be formed on the second phase change material layer 130 and formed as described for the first outer electrode 110.

A chemical mechanical polishing (CMP) technique may be used to remove excess material and polish upper surfaces of the structure 100, providing a uniform horizontal surface of the second outer electrode 132.

Figure 5:
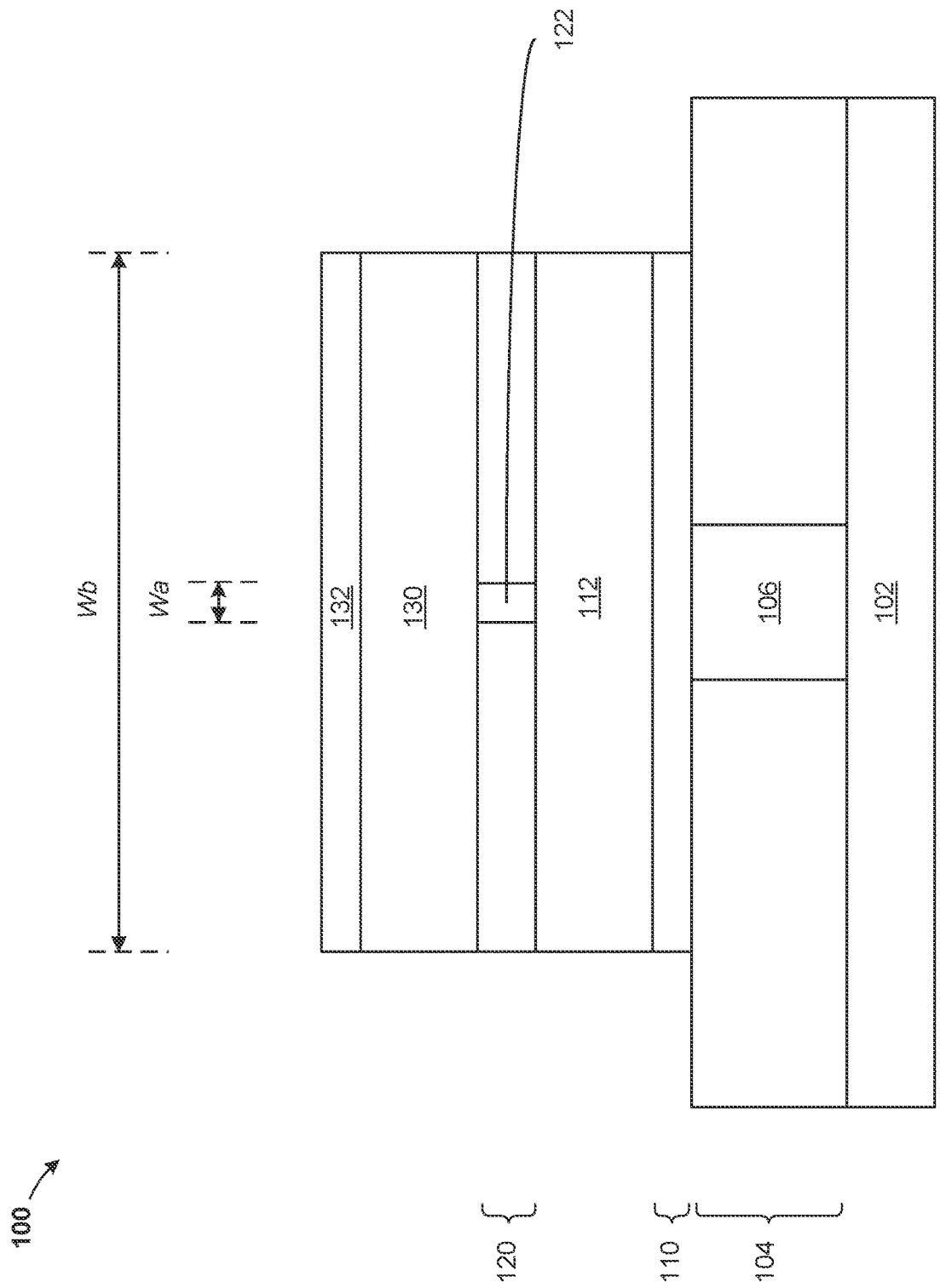
FIG. 5 illustrates a cross-sectional view of the semiconductor structure illustrating selective removal of portions of the semiconductor structure, according to an exemplary embodiment.

Referring now to FIG. 5, the structure 100 is shown according to an embodiment. The structure 100 may be patterned into an individual cell.

After the aforementioned layers and materials are formed or deposited, they are patterned into an individual cell, as depicted. The individual cell can be formed using patterning techniques known in the art. More specifically, portions of the second outer electrode 132, the second phase change material layer 130, the dielectric layer 120, the first phase change material layer 112 and the first outer electrode 110 may be selectively removed using an anisotropic etching technique, such as, for example, reactive ion etching. The cell may include vertically aligned portions of the second outer electrode 132, the second phase change material layer 130, the dielectric layer 120, the first phase change material layer 112 and the first outer electrode 110. Preferably, an upper surface of the dielectric layer 104 is exposed as a result of patterning the aforementioned layers. In general, a footprint of the individual cells will mimic existing phase change memory pillar cells and be similarly limited based on the function of a phase change memory pillar cell. For example, a typical phase change memory pillar cell may have a lateral width or diameter ranging from about 10 nm to about 200 nm.

A width or a diameter of the inner electrode 122, Wa, is substantially less than a width or a diameter of the first and second outer electrodes 110, 132, Wb. In an embodiment, Wa is 5 times smaller than Wb. In an embodiment, Wa may be between 5 and 50 times smaller than Wb. In an embodiment, Wa, is smaller than Wb of each of the first and second outer electrodes 110, 132. In an embodiment, the first and second outer electrodes 110, 132 may each have a smaller width or diameter than the other.

Figure 6:
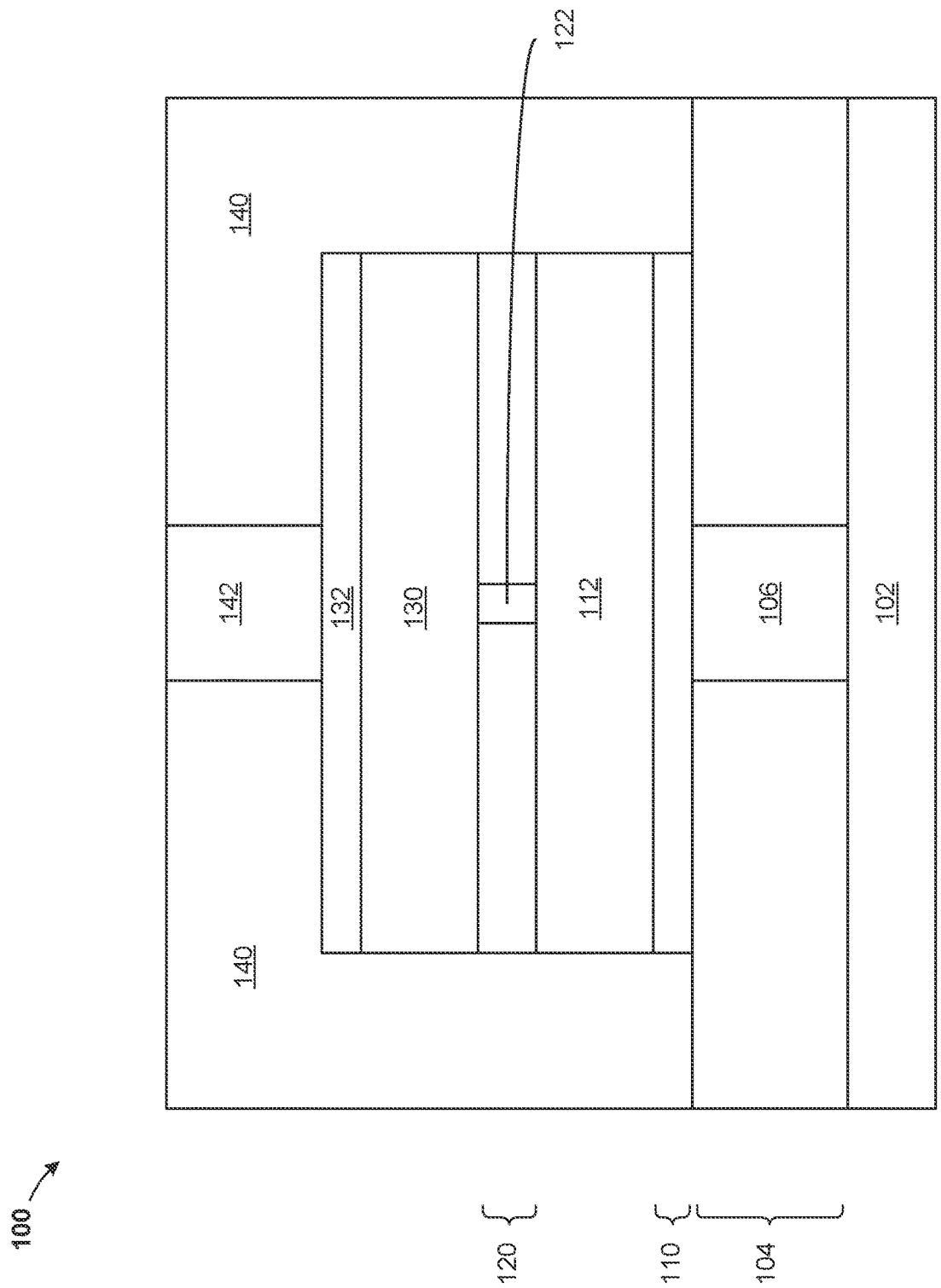
FIG. 6 illustrates a cross-sectional view of the semiconductor structure illustrating depositing a dielectric and a top contact, according to an exemplary embodiment.
Figure 7:
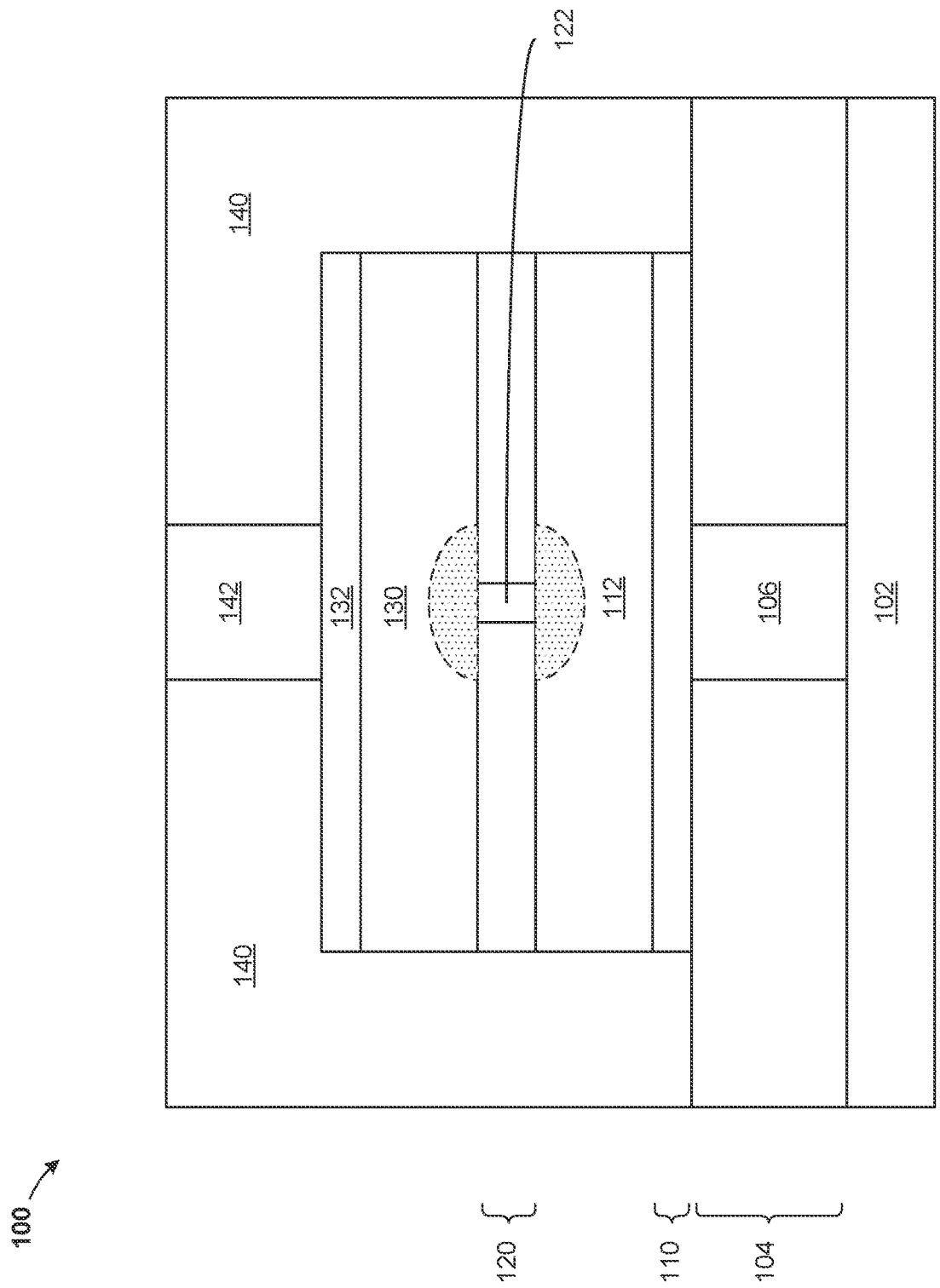
FIG. 7 illustrates the cross-sectional view of the semiconductor structure of FIG. 6, and illustrates a symmetric amorphous configuration, according to an exemplary embodiment.

Referring now to FIGS. 6 and 7, the structure 100 is shown according to an embodiment. A dielectric layer 140 and a top contact 142 may be formed.

The dielectric layer 140 may be formed as described for the dielectric layer 104. A second opening (not shown) may be formed in the dielectric layer 140, exposing a portion of an upper surface of the second outer electrode 132. The second opening may be formed by methods known in the arts. The top contact 142 may be formed in the second opening (not shown). The top contact 142 may be formed as described for the bottom contact 106.

A chemical mechanical polishing (CMP) technique may be used to remove excess material and polish upper surfaces of the structure 100, providing a uniform horizontal surface of the dielectric layer 140 and the top contact 142.

As shown in FIG. 7, a portion of each of the first phase change material layer 112 and the second phase change material layer 130 is shown as dotted. The dotted portion indicates a mushroom shaped portion which may first be amorphized when current may be applied to the inner electrode 122 (which may be referred to as the heater electrode).

A traditional phase change memory cell may include the bottom contact 106, the first outer electrode 110 (which may be referred to as a bottom electrode), the first phase change material layer 112, a top electrode directly above the phase change material layer 112 and a top contact on the top electrode. In this invention, the inner electrode 122 and the second phase change material layer 130 are added between the first phase change material layer 112 and the first outer electrode 110 (which may be referred to as the top electrode).

The additional layers of the inner electrode 122 and the second phase change material layer 130 provide a physically symmetric mushroom cell device with reduced programming current due to improved thermal confinement from phase change material both above and below the heater electrode, and has lower power consumption during analog computing.

Although only one individual cell is shown, it should be noted that the structure 100 would typically include an array of several thousand cells all formed according the methods disclosed herein.

Referring now to FIGS. 8 to 12, an alternate embodiment is shown.

Figure 8:
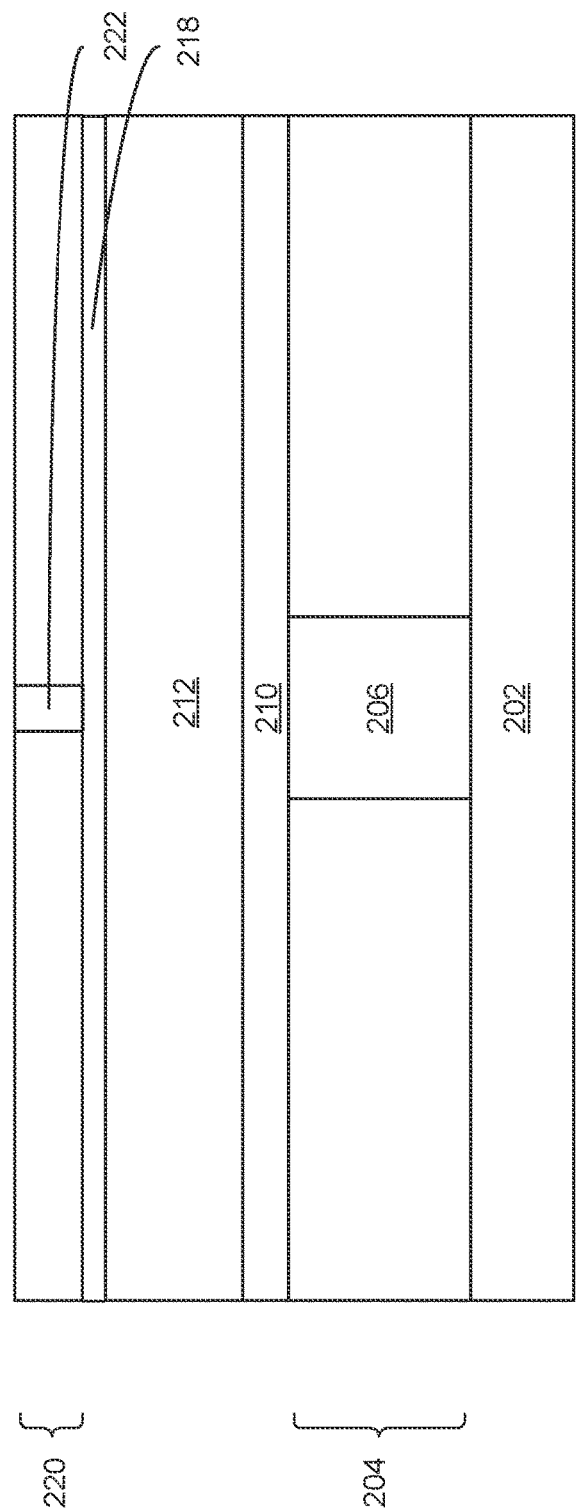
FIG. 8 illustrates a cross-sectional view of a second semiconductor structure at an intermediate stage of fabrication, according to an exemplary embodiment.

Referring now to FIG. 8, a semiconductor structure (hereinafter "structure") 200 is shown at an intermediate step of fabrication, according to an embodiment. The structure 200 may include a stack of layers formed on top of a substrate 202 and subsequently patterned into individual cells. The structure 200 includes, for example, a dielectric layer 204, a bottom contact 206, a first outer electrode 210, a first phase change material layer 212, a first liner 218, a dielectric layer 220 and an inner electrode 222.

Similarly named items are formed as described above, including the substrate 202, the dielectric layer 204, the bottom contact 206, the first outer electrode 210 and the first phase change material layer 212, the dielectric layer 220 and the inner electrode 222.

The first liner 218 may be blanket deposited on top of the first phase change material layer 212. The first liner 218 may include any suitable barrier material known in the art, such as titanium nitride (TiN), tantalum nitride (TaN), cobalt, ruthenium, carbon (C), amorphous carbon, titanium carbide (TiC), tantalum carbide (TaC), titanium aluminium nitride (TiAlN), tantalum aluminium nitride (TaAlN), titanium aluminium carbide (TiAlC), tantalum aluminium carbon (TaAlC), hafnium nitride (HfN) or tungsten nitride (WN) either alone or in combination with other suitable barrier material. The first liner 218 may also be referred to as an etch stop, due to when patterning the via for the inner electrode 222, the etch that is used to create the opening for the inner electrode 222e can stop when it reaches the first liner 218. Therefore even though the first liner 218 has an electrical use for conductivity, it can aid in the processing by being an etch stop.

The first liner 218 may include one or more layers and may include a thermal barrier layer, an adhesion layer and a projection liner which reduces programming current and drift.

The dielectric layer 220 may be formed on the first liner 218 and formed as described for the dielectric layer 104. The inner electrode 222 may be formed in a third opening (not shown) in the dielectric layer 220 and formed as described for the inner electrode 122. A chemical mechanical polishing (CMP) technique may be used to remove excess material and polish upper surfaces of the structure 200, providing a uniform horizontal surface.

Figure 9:
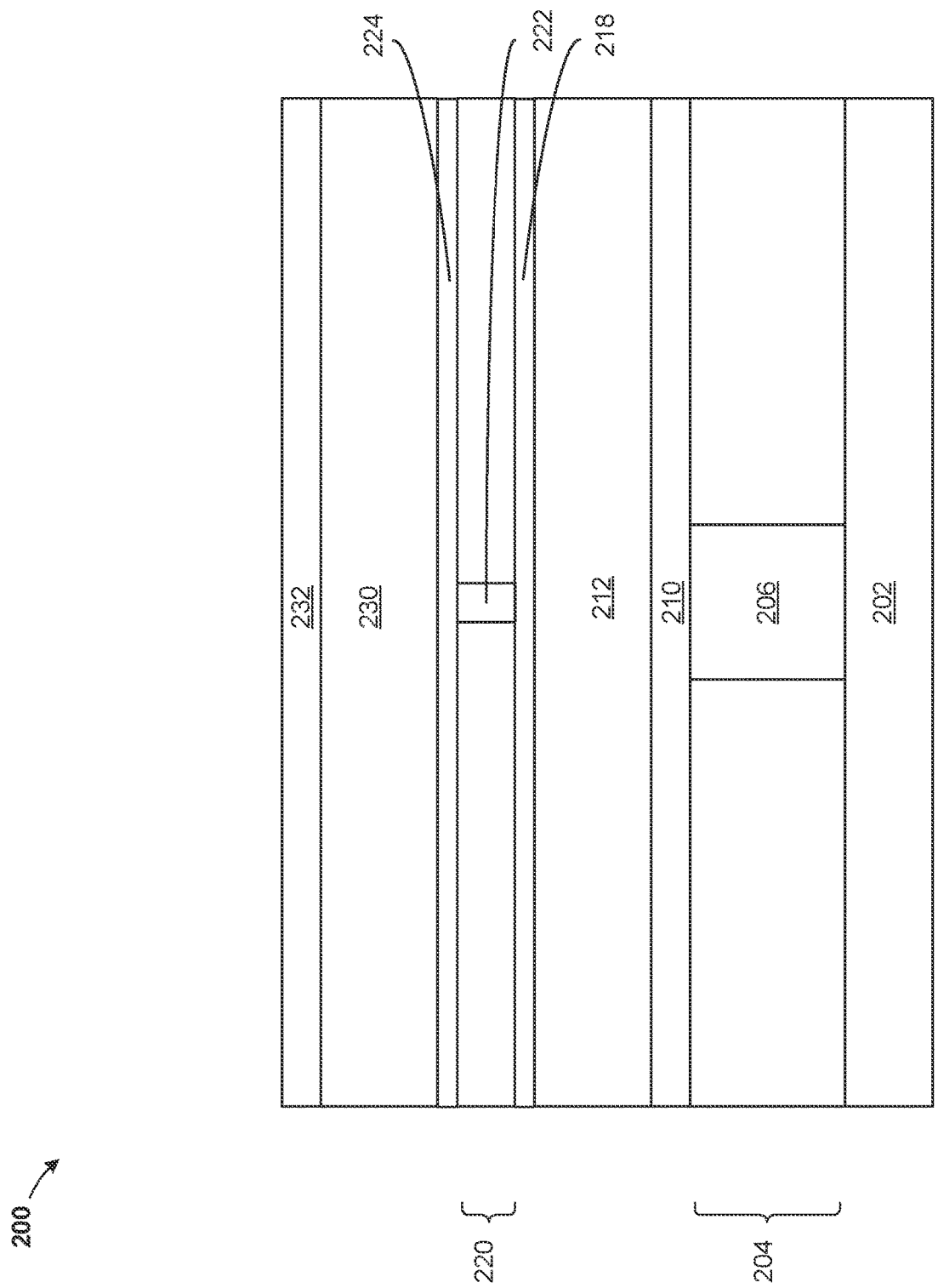
FIG. 9 illustrates a cross-sectional view of the second semiconductor structure illustrating forming a liner, forming a second phase change material layer and forming a second outer electrode, according to an exemplary embodiment.

Referring now to FIG. 9, the structure 200 is shown according to an embodiment. A second liner 224, a second phase change material layer 230 and a second outer electrode 210 may be formed.

The second liner 224 may be formed on the dielectric layer 220 and the inner electrode 222. The second liner 224 may be formed as described for the first liner 218. The second outer electrode 210 may be formed on the second liner 224 as described for the first outer electrode 110.

According to the present embodiment, the first liner 218 acts as a barrier, physically separating the first phase change material layer 212 from subsequent layers formed thereon. The second liner 224 acts as a barrier, physically separating the second phase change material layer 230 from the dielectric layer 220 and the inner electrode 222. In an embodiment, the first liner 218 and the second liner 224 may each have a thickness ranging from about 1 nm to about 30 nm, although a thickness less than 1 nm and greater than 30 nm may be acceptable.

Figure 10:
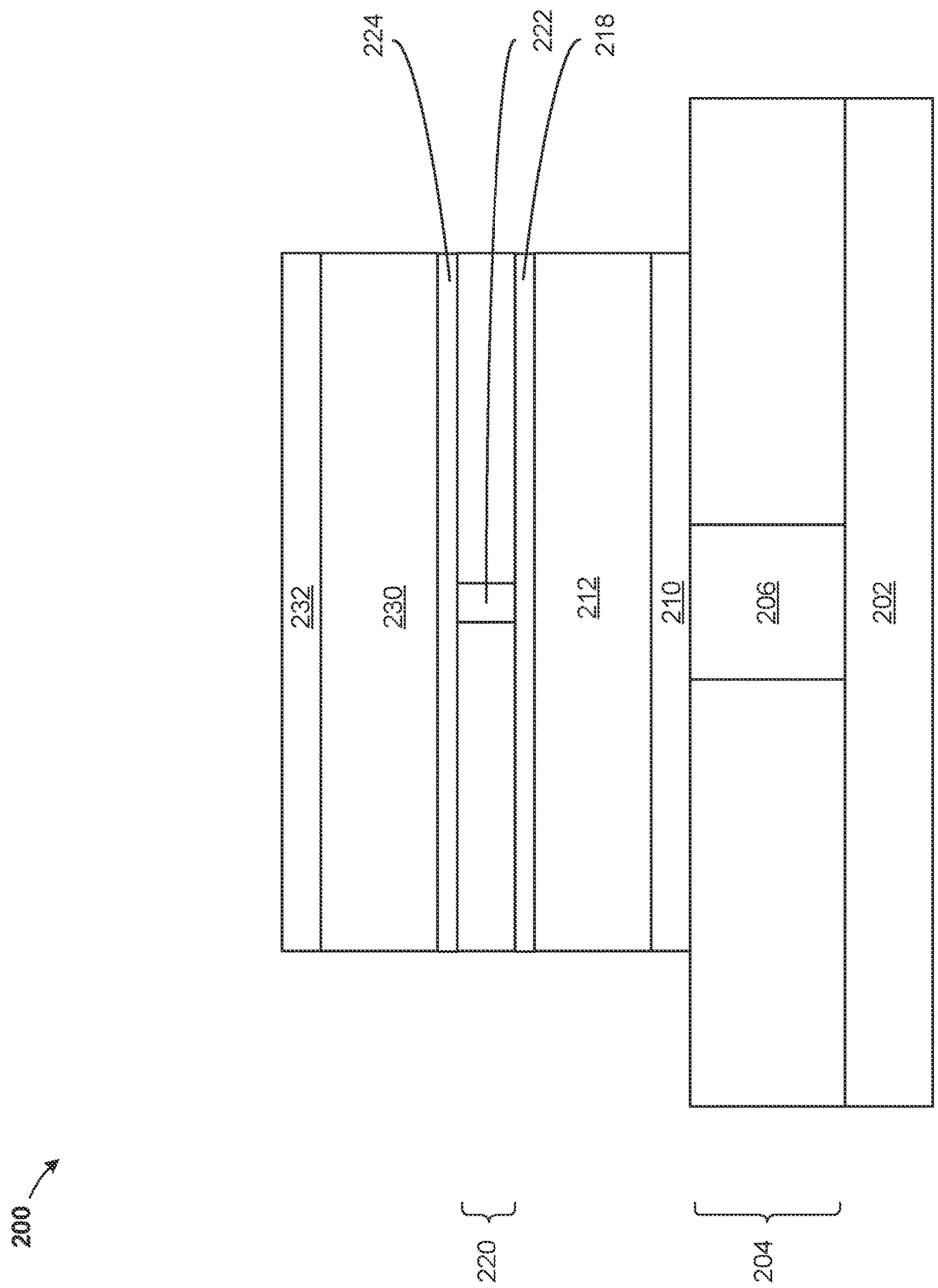
FIG. 10 illustrates a cross-sectional view of the second semiconductor structure illustrating selective removal of portions of the semiconductor structure, according to an exemplary embodiment.

Referring now to FIG. 10, the structure 200 is shown according to an embodiment. The structure 200 may be patterned into an individual cell.

After the aforementioned layers and materials are formed or deposited, they are patterned into an individual cell, as depicted. The individual cell can be formed using patterning techniques known in the art. More specifically, portions of the second outer electrode 232, the second phase change material layer 230, second liner 224, the dielectric layer 220, the first liner 218, the first phase change material layer 212 and the first outer electrode 210 may be selectively removed using an anisotropic etching technique, such as, for example, reactive ion etching. The cell may include vertically aligned portions of the second outer electrode 232, the second phase change material layer 230, the second liner 224, the dielectric layer 220, the first liner 218, the first phase change material layer 212 and the first outer electrode 210. Preferably, an upper surface of the dielectric layer 204 is exposed as a result of patterning the aforementioned layers. In general, a footprint of the individual cells will mimic existing phase change memory pillar cells and be similarly limited based on the function of a phase change memory pillar cell. For example, a typical phase change memory pillar cell may have a lateral width or diameter ranging from about 10 nm to about 200 nm.

Figure 11:
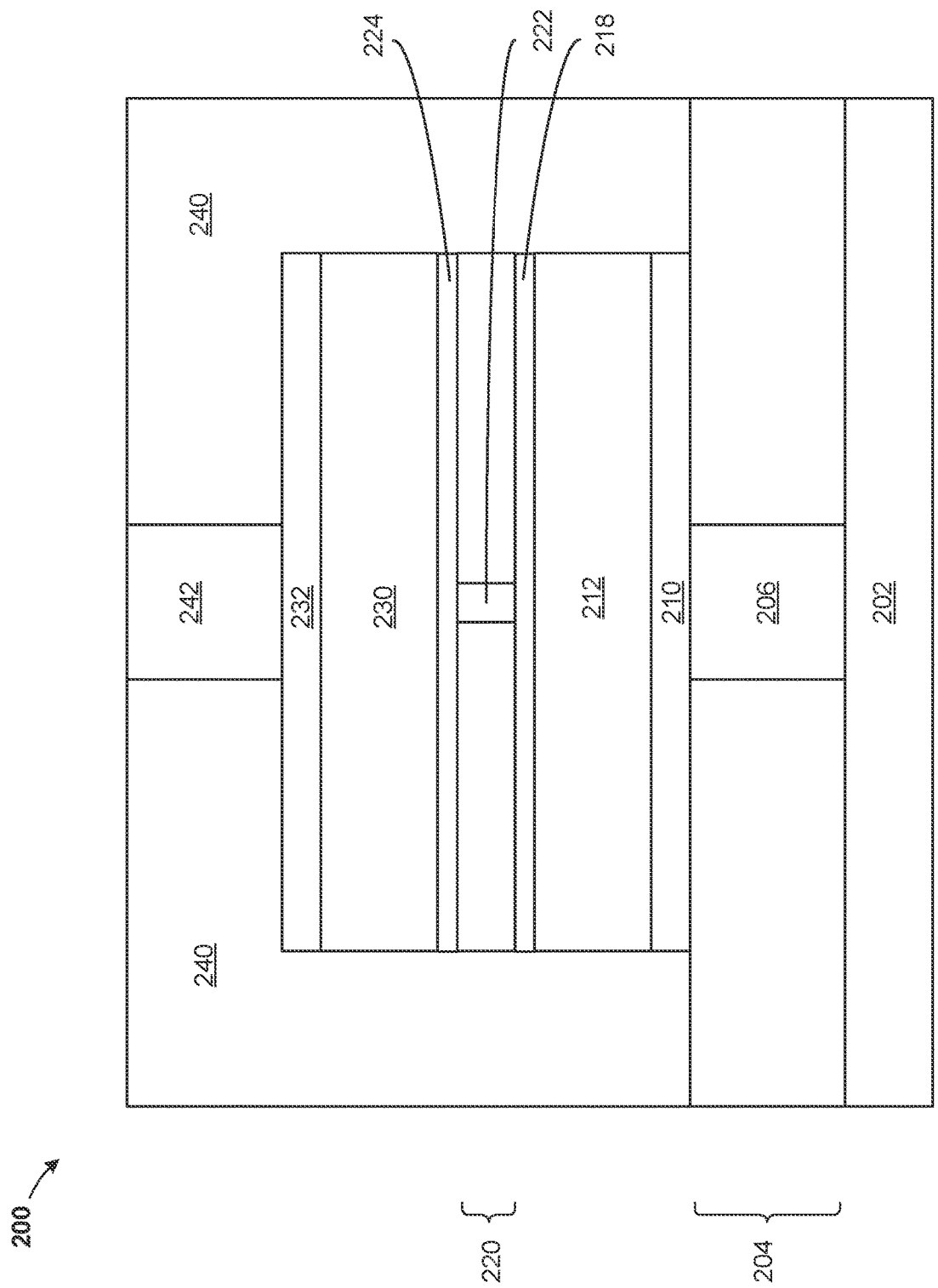
FIG. 11 illustrates a cross-sectional view of the second semiconductor structure illustrating depositing a dielectric and a top contact, according to an exemplary embodiment.
Figure 12:
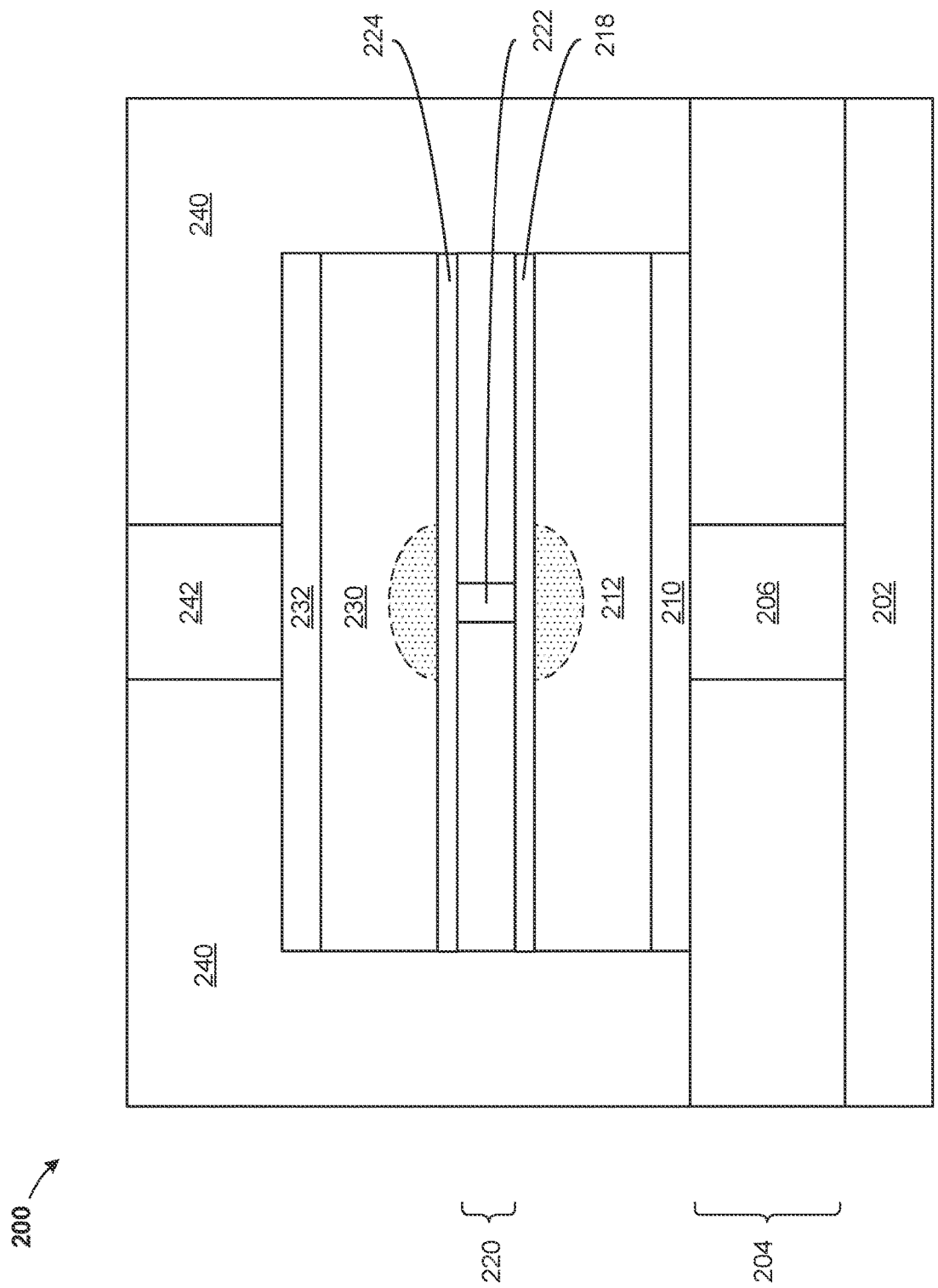
FIG. 12 illustrates the cross-sectional view of the second semiconductor structure of FIG. 11 and illustrates a symmetric amorphous configuration, according to an exemplary embodiment.

Referring now to FIGS. 11 and 12, the structure 200 is shown according to an embodiment. A dielectric layer 240 and a top contact 242 may be formed.

The dielectric layer 240 may be formed as described for the dielectric layer 104. A fourth opening (not shown) may be formed in the dielectric layer 240, exposing a portion of an upper surface of the second outer electrode 232. The fourth opening may be formed by methods known in the arts. The top contact 242 may be formed in the fourth opening (not shown). The top contact 242 may be formed as described for the bottom contact 106.

A chemical mechanical polishing (CMP) technique may be used to remove excess material and polish upper surfaces of the structure 200, providing a uniform horizontal surface of the dielectric layer 240 and the top contact 242.

As shown in FIG. 12, a portion of each of the first phase change material layer 212 and the second phase change material layer 230 is shown as dotted. The dotted portion indicates a mushroom shaped portion which may first be amorphized when current may be applied to the inner electrode 222 (which may be referred to as the heater electrode).

The additional layers of the inner electrode 222 and the second phase change material layer 230 provide a physically symmetric mushroom cell device with reduced programming current due to improved thermal confinement from phase change material both above and below the heater electrode, and has lower power consumption during analog computing.

In comparison of the structure 100 of FIGS. 7 and 8 and the structure 200 of FIGS. 11 and 12, the second liner 224 and the first liner 218 are additional layers of the structure 200. The first liner 218 and the second liner 224 each act as a barrier, physically separating the first, seconds phase change material layers 212, 230 from the dielectric layer 220 and the inner electrode 222.

Although only one individual cell is shown, it should be noted that the structure 200 would typically include an array of several thousand cells all formed according the methods disclosed herein.

Figure 13:
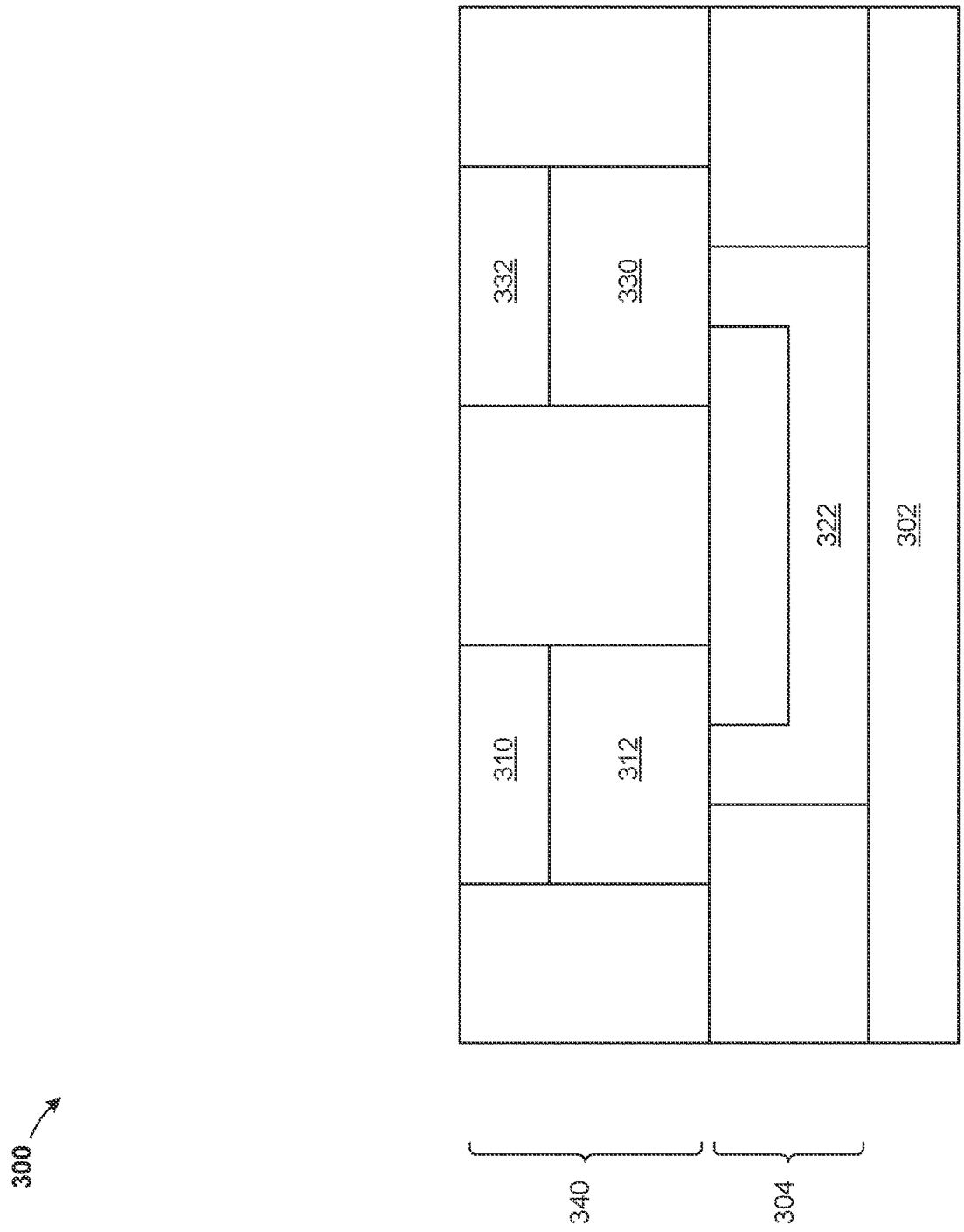
FIG. 13 illustrates a cross-sectional view of a third semiconductor structure according to an embodiment.

Referring now to FIG. 13, an alternate embodiment is shown.

Referring now to FIG. 13, a semiconductor structure (hereinafter "structure") 300 is shown at an intermediate step of fabrication, according to an embodiment. The structure 300 may include a stack of layers formed on top of a substrate 302 and subsequently patterned into individual cells. The structure 300 includes, for example, a dielectric layer 304, a first outer electrode 310, a first phase change material layer 312, a dielectric layer 340, a second phase change material layer 330, a second outer electrode 342 and an inner electrode 322.

Similarly named items are formed as described above, including the substrate 302, the dielectric layer 304, the first outer electrode 310, the first phase change material layer 312, the dielectric layer 340, the second phase change material layer 330, the second outer electrode 342 and the inner electrode 322.

The inner electrode 322 may be formed in the dielectric layer 304, with a portion of the inner electrode 322 buried in the dielectric layer 304 and two separate portions extending to an upper surface which is coplanar with an upper surface of the dielectric layer 304. A phase change material layer (not shown) may be formed on the dielectric layer 304 and the inner electrode 322. An electrode layer (not shown) may be formed on the phase change material layer (not shown). The phase change material layer (not shown) and the electrode layer (not shown) may be patterned into vertically aligned first outer electrode 310 and first phase change material layer 312 and separately vertically aligned second outer electrode 332 and second phase change material layer 330. The dielectric layer 340 may be formed surrounding vertically aligned the first outer electrode 310 with the first phase change material layer 312 and separately the vertically aligned the second outer electrode 332 with the second phase change material layer 330. A contact (not shown) may be formed to each of the first outer electrode 310 and the second outer electrode 342. The vertically aligned first outer electrode 310 and first phase change material layer 312 may be aligned over a first portion of the inner electrode which is coplanar with the upper surface of the dielectric layer 304. The vertically aligned second outer electrode 332 and second phase change material layer 330 may be aligned over a second portion of the inner electrode which is coplanar with the upper surface of the dielectric layer 304.

The structure 300 may be an individual cell. Although only one individual cell is shown, it should be noted that the structure 300 would typically include an array of several thousand cells all formed according the methods disclosed herein.

The structure 300 provides a physically symmetric mushroom cell device with reduced programming current due to improved thermal confinement from phase change material both above and below the heater electrode, and has lower power consumption during analog computing.

In comparison of the structure 100 of FIGS. 7 and 8 and the structure 300 of FIG. 13, the structure 300 may be more easily manufacturable, however the structure 300 may consume more surface area for wiring.

Figure 14:
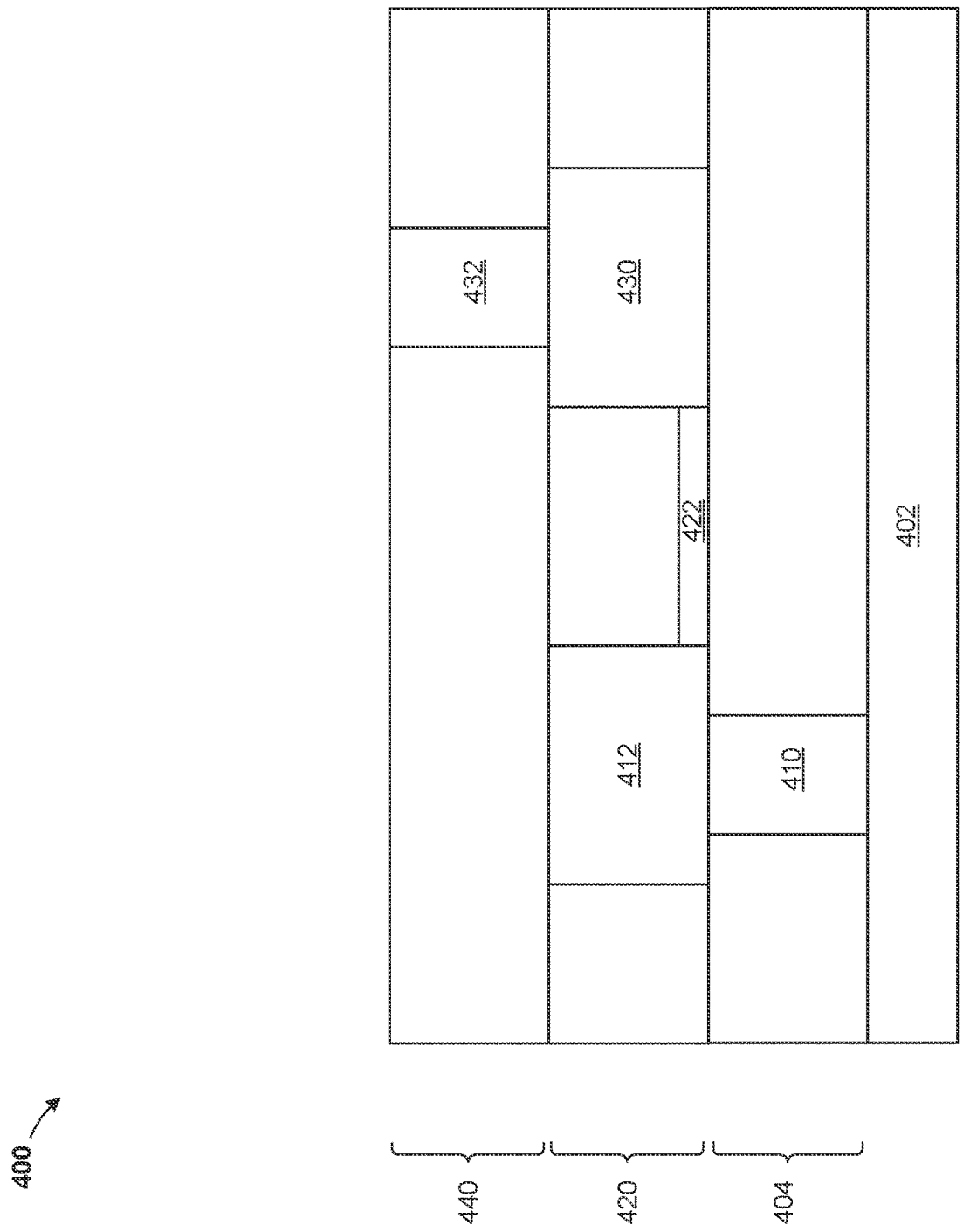
FIG. 14 illustrates a cross-sectional view of a fourth semiconductor structure according to an embodiment.

Referring now to FIG. 14, a semiconductor structure (hereinafter "structure") 400 is shown at an intermediate step of fabrication, according to an embodiment. The structure 400 may include a stack of layers formed on top of a substrate 402 and subsequently patterned into individual cells. The structure 400 includes, for example, a dielectric layer 404, a first outer electrode 410, a dielectric layer 420 a first phase change material layer 412, a second phase change material layer 430, a dielectric layer 440, a second outer electrode 432 and an inner electrode 422.

Similarly named items are formed as described above, including the substrate 402, the dielectric layer 404, the first outer electrode 410, the dielectric layer 420, the first phase change material layer 412, the dielectric layer 440, the second phase change material layer 430, the second outer electrode 432 and the inner electrode 422.

The first outer electrode 410 may be formed in the dielectric layer 404. A phase change material layer (not shown) may be formed on the dielectric layer 404 and the inner electrode 422. The phase change material layer (not shown) may be patterned into the first phase change material layer 412 and the second phase change material layer 430, where the first phase change material layer 412 is aligned over and connected to the first outer electrode 410. The inner spacer 442 may be formed on the dielectric layer 404 connecting the first phase change material layer 412 and the second phase change material layer 430. The dielectric layer 420 may be formed surrounding the first phase change material layer 412, the inner electrode 422 and the second phase change material layer 430. The dielectric layer 440 may be formed. A fifth opening (not shown) may be formed in the dielectric layer 440 exposing a portion of an upper surface of the second phase change material layer 430. The second outer electrode 432 may be formed in the fifth opening (not shown), aligned with and physically connected to the second phase change material layer 430. A contact (not shown) may be formed to each of the first outer electrode 410 and the second outer electrode 432.

The structure 400 may be an individual cell. Although only one individual cell is shown, it should be noted that the structure 400 would typically include an array of several thousand cells all formed according the methods disclosed herein.

The structure 400 provides a physically symmetric mushroom cell device with reduced programming current due to improved thermal confinement from phase change material both above and below the heater electrode, and has lower power consumption during analog computing.

In comparison of the structure 100 of FIGS. 7 and 8, the structure 300 of FIG. 13, and the structure 400 of FIG. 14, the structure 400 may be more easily manufacturable, however the structure 300 may consume more surface area for wiring.

Figure 15:
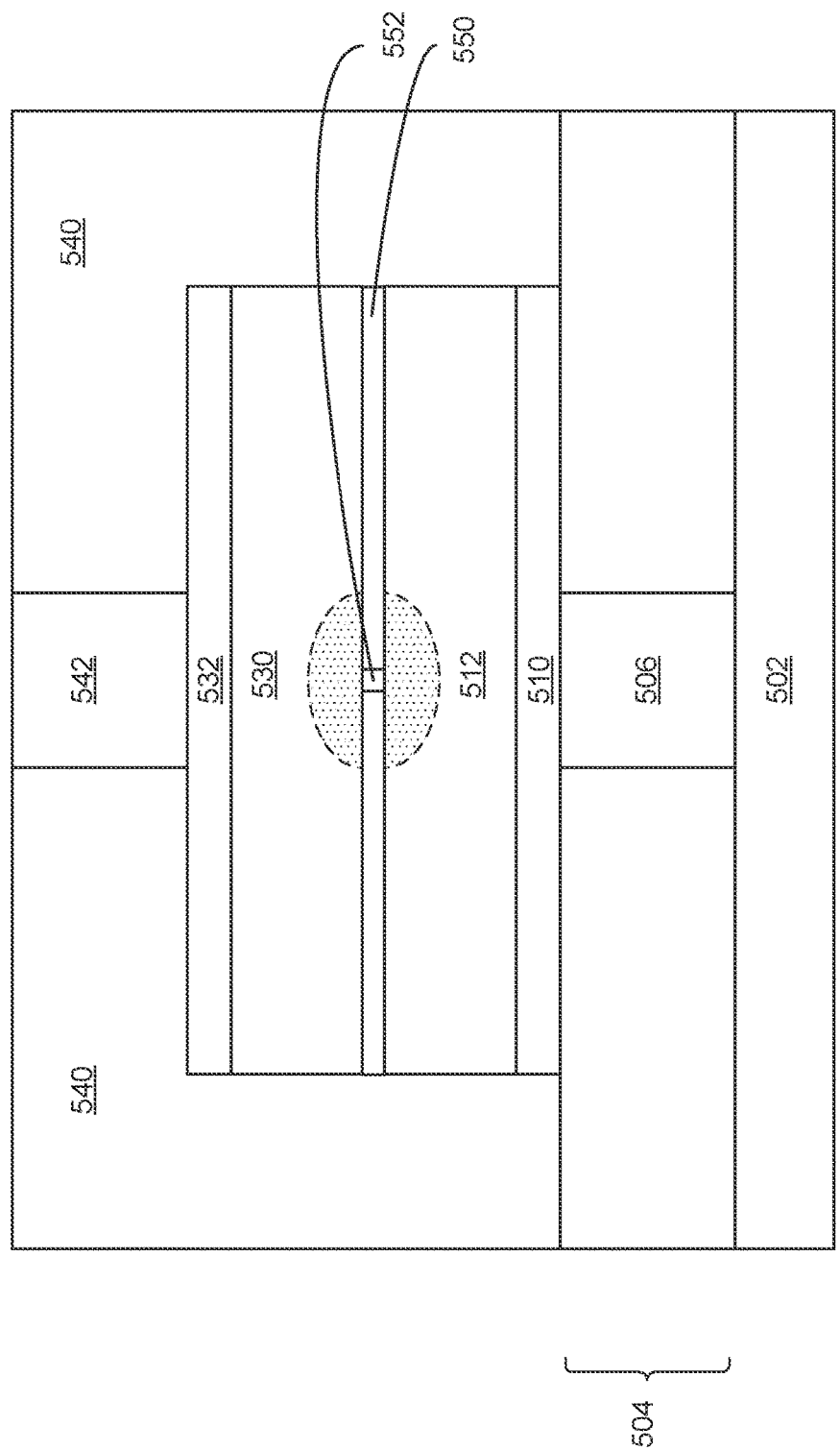
FIG. 15 illustrates a cross-sectional view of a fifth semiconductor structure according to an embodiment.
Figure 16:
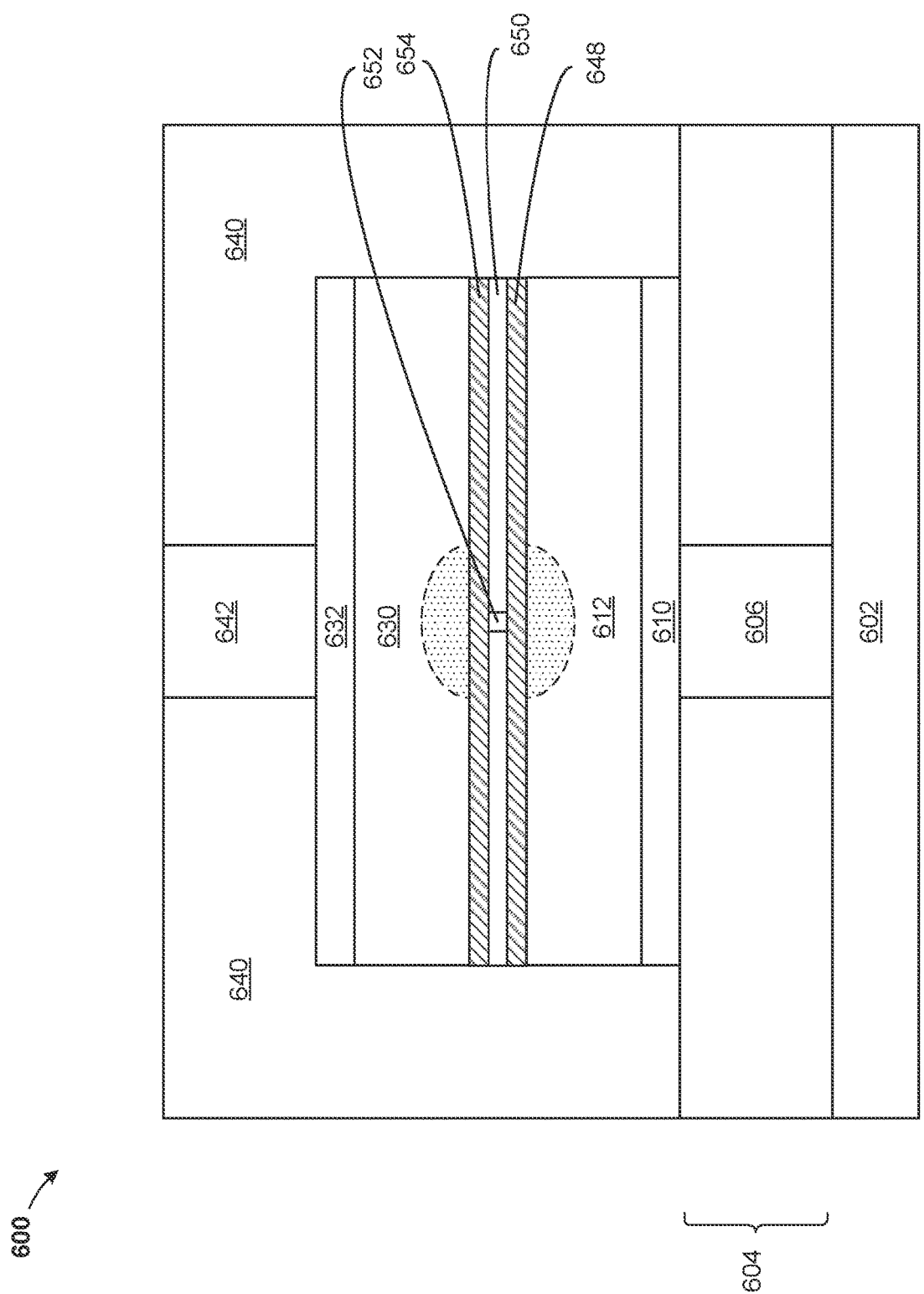
FIG. 16 illustrates a cross-sectional view of a sixth semiconductor structure according to an embodiment.
Figure 17:
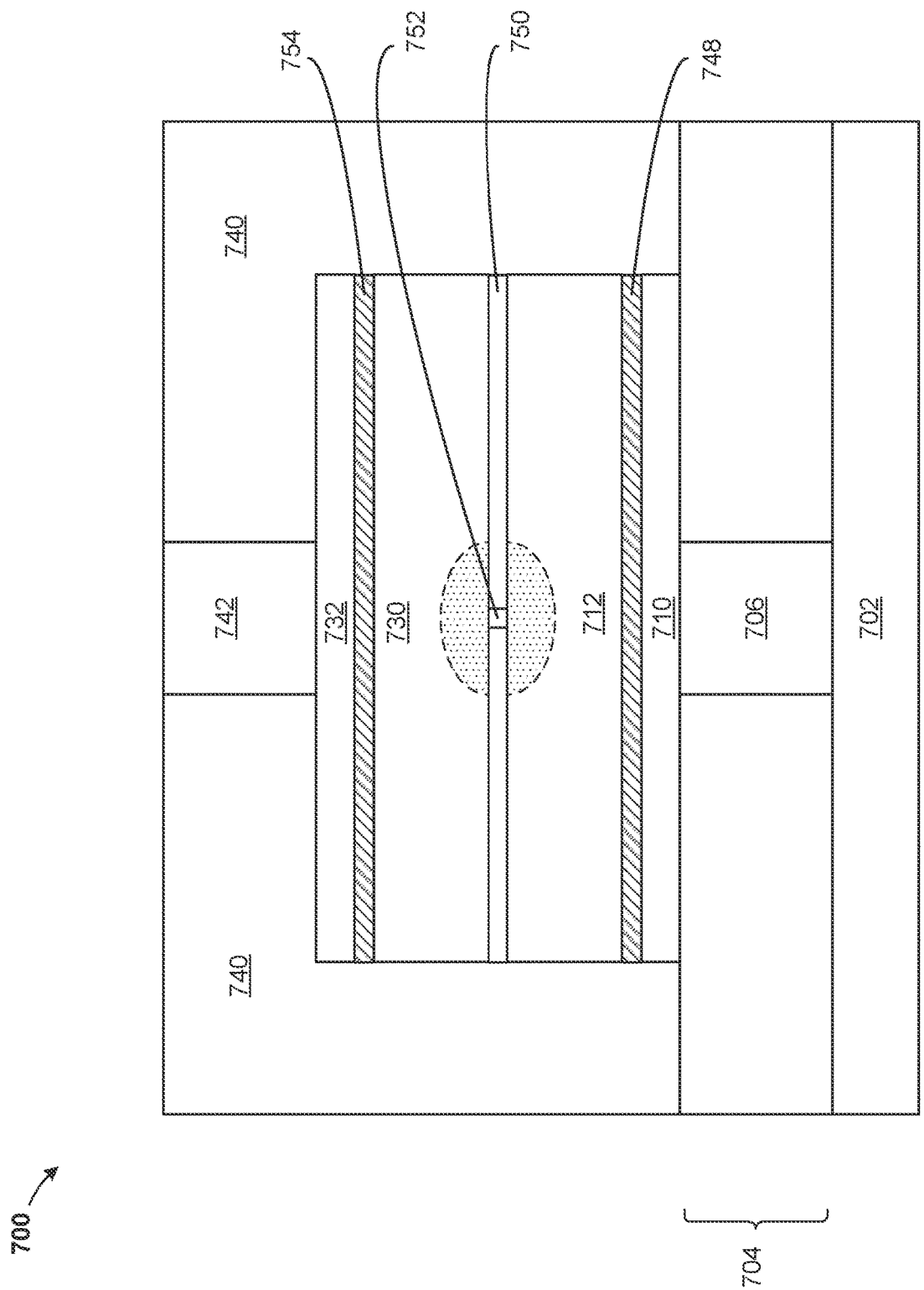
FIG. 17 illustrates a cross-sectional view of a seventh semiconductor structure according to an embodiment.

Referring now to FIGS. 15-17, alternate embodiments are shown and described using a conductive filament between two phase change material layers rather than an inner electrode. There are two embodiments to form the conductive filament. The conductive filament may be formed by using a high-k dielectric layer which breaks down to form the conductive filament. Alternatively, a mixed ionic electronic conducting filament device may be used.

Referring now to FIG. 15, a semiconductor structure (hereinafter "structure") 500 is shown at an intermediate step of fabrication, according to an embodiment. The structure 500 may include a stack of layers formed on top of a substrate 502 and subsequently patterned into individual cells. The structure 500 includes, for example, a dielectric layer 504, a bottom contact 506, a first outer electrode 510, a first phase change material layer 512, a second phase change material layer 530, a dielectric layer 540, a second outer electrode 532 and a top contact 542.

The structure 500 also includes, for example, a filament layer 550 and a filament layer break 552. The filament layer 550 and the filament layer break 552 are not present on previous embodiments.

Similarly named items are formed as described above, including the substrate 502, the dielectric layer 504, the bottom contact 506, the first outer electrode 510, the first phase change material layer 512, the second phase change material layer 530, the dielectric layer 540, the second outer electrode 532 and the top contact 542.

The filament layer 550 may be conformally formed on the first phase change material layer 512. The filament layer 550 may include a high-k dielectric layer, for example a MOX (metal oxide semiconductor), such as tantalum oxide ($Ta_2O_5$) and hafnium oxide ($HfO_2$). The filament layer 550 may include one or more layers of one or more materials. The filament layer 550 may be formed by PVD (physical vapor deposition). A thickness of the filament layer 550 may be between 1 nm and 50 nm, although thicknesses may be less than 1 nm or greater than 50 nm. The filament layer 550 may include one or more layers of one or more materials. In an embodiment, the filament layer 550 includes a material with a dielectric constant equal to or greater than 3.9.

In an embodiment, the dielectric layer 504 and the dielectric layer 540 may include a material with a dielectric contestant less than or equal to 3.9. In an embodiment, the dielectric layer 504 and the dielectric layer 540 may each have a dielectric constant less than the filament layer 550.

In an embodiment, the filament layer 550 may include a mixed ionic electronic conducting (MIEC) filament, for example silicon (Si), or silver (Ag) with ion barriers. Ion barriers are an energy barrier for an ion to move in physical space. The ion stays in place until sufficient energy (e.g. electric field) overcomes the barrier.

The second phase change material layer 530 may be formed conformally on the filament layer 550. The structure 500 may be patterned into an individual cell as described above.

A portion of the filament layer 550 may become the filament layer break 552 by a high voltage pulse or by applying a large enough electric field to induce dielectric breakdown in the filament layer 550 to form a conductive bridge.

The filament layer break 552 is a conductive path between the first phase change material layer 512 and the second phase change material layer 530.

The structure 500 may be an individual cell. Although only one individual cell is shown, it should be noted that the structure 500 would typically include an array of several thousand cells all formed according the methods disclosed herein.

The structure 500 provides a physically symmetric mushroom cell device with reduced programming current due to improved thermal confinement from phase change material both above and below the filament layer break 552, and has lower power consumption during analog computing.

As shown in FIG. 15, a portion of each of the first phase change material layer 512 and the second phase change material layer 530 is shown as dotted. The dotted portion indicates a mushroom shaped portion which may first be amorphized when current is applied to the filament layer break 552 (which may be referred to as the heater electrode).

Referring now to FIG. 16, a semiconductor structure (hereinafter "structure") 600 is shown at an intermediate step of fabrication, according to an embodiment. The structure 600 may include a stack of layers formed on top of a substrate 602 and subsequently patterned into individual cells. The structure 600 includes, for example, a dielectric layer 604, a bottom contact 606, a first outer electrode 610, a first phase change material layer 612, a second phase change material layer 630, a dielectric layer 640, a second outer electrode 632 and a top contact 642. The structure 600 also includes, for example, a filament layer 650, a filament layer break 652, a first liner 648 and a second liner 654.

Similarly named items are formed as described above, including the substrate 602, the dielectric layer 604, the bottom contact 606, the first outer electrode 610. the first phase change material layer 612, the second phase change material layer 630, the dielectric layer 640, the second outer electrode 632, the top contact 642, the filament layer 650 and the filament layer break 652.

The first liner 648 may be formed on the first phase change material layer 612. The first liner 648 may be formed as described for the first liner 218. The filament layer 650 may be conformally formed on the first liner 648. The second liner 654 may be formed on the filament layer 650. The second liner 654 may be formed as described for the first liner 218. The second phase change material layer 630 may be formed conformally on the filament layer 650.

The structure 600 may be patterned into an individual cell as described above. The dielectric layer 640 and the top contact 642 may be formed as described above.

A portion of the filament layer 650 may become the filament layer break 652 as described for the filament break 552. The filament layer break 652 is a conductive path between the first phase change material layer 612 and the second phase change material layer 630.

The structure 600 may be an individual cell. Although only one individual cell is shown, it should be noted that the structure 600 would typically include an array of several thousand cells all formed according to the methods disclosed herein.

The structure 600 provides a physically symmetric mushroom cell device with reduced programming current due to improved thermal confinement from phase change material both above and below the filament layer break 652, and has lower power consumption during analog computing.

According to the present embodiment, the first liner 648 acts as a barrier, physically separating the first phase change material layer 612 from subsequent layers formed thereon. The second liner 654 acts as a barrier, physically separating the second phase change material layer 630 from the filament layer 650 and the filament layer break 652. In an embodiment, the first liner 648 and the second liner 654 may each have a thickness ranging from about 1 nm to about 30 nm, although a thickness less than 1 nm and greater than 30 nm may be acceptable.

The structure 600 provides a physically symmetric mushroom cell device with reduced programming current due to improved thermal confinement from phase change material both above and below the filament layer break 652, and has lower power consumption during analog computing.

As shown in FIG. 16, a portion of each of the first phase change material layer 612 and the second phase change material layer 630 is shown as dotted. The dotted portion indicates a mushroom shaped portion which may first be amorphized when current is applied to the filament layer break 652 (which may be referred to as the heater electrode).

Referring now to FIG. 17, a semiconductor structure (hereinafter "structure") 700 is shown at an intermediate step of fabrication, according to an embodiment. The structure 700 may include a stack of layers formed on top of a substrate 702 and subsequently patterned into individual cells. The structure 700 includes, for example, a dielectric layer 704, a bottom contact 706, a first outer electrode 710, a first phase change material layer 712, a second phase change material layer 730, a dielectric layer 740, a second outer electrode 732 and a top contact 742. The structure 700 also includes, for example, a filament layer 750, a filament layer break 752, a first liner 748 and a second liner 754.

Similarly named items are formed as described above, including the substrate 702, the dielectric layer 704, the bottom contact 706 and the first outer electrode 710, the first phase change material layer 712, the second phase change material layer 730, the dielectric layer 740, the second outer electrode 732, the top contact 742, the filament layer 750, the filament layer break 752, the first liner 748 and the second liner 754.

The first liner 748 may be formed on the first outer electrode 710. The first phase change material layer 712 may be formed on the first liner 748. The filament layer 750 may be conformally formed on the first phase change material layer 712. The second liner 754 may be on the filament layer 750.

The structure 700 may be patterned into an individual cell as described above. The dielectric layer 740 and the top contact 742 may be formed.

A portion of the filament layer 750 may become the filament layer break 752. The filament layer break 752 is a conductive path between the first phase change material layer 712 and the second phase change material layer 730.

The structure 700 may be an individual cell. Although only one individual cell is shown, it should be noted that the structure 700 would typically include an array of several thousand cells all formed according the methods disclosed herein.

The structure 700 provides a physically symmetric mushroom cell device with reduced programming current due to improved thermal confinement from phase change material both above and below the filament layer break 752, and has lower power consumption during analog computing.

According to the present embodiment, the first liner 748 acts as a barrier, physically separating the first phase change material layer 712 from the first outer electrode 710. The second liner 754 acts as a barrier, physically separating the second phase change material layer 730 from the second outer electrode 732.

The structure 7600 provides a physically symmetric mushroom cell device with reduced programming current due to improved thermal confinement from phase change material both above and below the filament layer break 752, and has lower power consumption during analog computing.

As shown in FIG. 17, a portion of each of the first phase change material layer 712 and the second phase change material layer 730 is shown as dotted. The dotted portion indicates a mushroom shaped portion which may first be amorphized when current is applied to the filament layer break 752 (which may be referred to as the heater electrode).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a first phase change material layer vertically aligned above a bottom electrode;
   a dielectric layer vertically aligned above the first phase change material layer;
   a second phase change material layer vertically aligned above the dielectric layer;
   an inner electrode physically and electrically connected to the first phase change material layer and the second phase change material layer, the inner electrode surrounded by the dielectric layer, wherein the inner electrode is the same material as the bottom electrode; and
   a top electrode vertically aligned above the second phase change material layer.

2. The structure according to claim 1, wherein a lateral diameter of the inner electrode is less than a lateral diameter of the bottom electrode.

3. The structure according to claim 1, further comprising:
   a first projection liner vertically aligned between the first phase change material layer and the dielectric layer; and
   a second projection liner vertically aligned between the second phase change material layer and the dielectric layer.

4. The structure according to claim 1, further comprising:
   a first thermal barrier layer vertically aligned between the first phase change material layer and the dielectric layer; and
   a second thermal barrier layer vertically aligned between the second phase change material layer and the dielectric layer.

5. The structure according to claim 1, further comprising:
   a first adhesion layer vertically aligned between the first phase change material layer and the dielectric layer; and
   a second adhesion layer vertically aligned between the second phase change material layer and the dielectric layer.

6. A structure comprising:
   a first phase change material layer aligned above a first portion of an inner electrode;
   a first outer electrode vertically aligned above the first phase change material layer, wherein the inner electrode is the same material as the first outer electrode;

a second phase change material layer aligned above a second portion of the inner electrode;
a second outer electrode vertically aligned above the second phase change material layer; and
a dielectric layer vertically physically and electrically separating the first phase change material layer and the first outer electrode from the second phase change material layer and the second outer electrode.

7. A structure comprising:
a first phase change material layer aligned above a first outer electrode;
an inner electrode physically and electrically connected between the first phase change material layer and a second phase change material layer, wherein the inner electrode is the same material as the first outer electrode;
a second outer electrode vertically aligned above the second phase change material layer; and
a dielectric layer vertically physically and electrically separating the first phase change material layer and the first outer electrode from the second phase change material layer and the second outer electrode.

8. A structure comprising:
a first phase change material layer vertically aligned above a bottom electrode;
a first liner vertically aligned above the first phase change material layer;
a filament layer vertically aligned above the first liner, wherein the first liner physically separates the first phase change material layer from the filament layer;
a second liner vertically aligned above the filament layer;
a second phase change material layer vertically aligned above the second liner, wherein the second liner physically separates the filament layer from the second phase change material layer;
an inner break in the filament layer connecting the first phase change material layer and the second phase change material layer; and
a top electrode vertically aligned above the second phase change material layer.

9. The structure according to claim 8, wherein the filament layer comprises a high-k dielectric.

10. The structure according to claim 8, wherein the filament layer comprises a mixed ionic electronic conducting filament.

11. The structure according to claim 8, wherein the first liner and the second liner are each a projection layer.

12. The structure according to claim 8, wherein the first liner and the second liner are each a thermal barrier layer.

13. The structure according to claim 8, wherein the first liner and the second liner are each an adhesion layer.

14. The structure according to claim 9, further comprising:
a first liner vertically aligned between the first phase change material layer and the bottom electrode; and
a second liner vertically aligned between the second phase change material layer and the top electrode.

15. The structure according to claim 14, wherein the first liner and the second liner are each a projection layer.

16. The structure according to claim 14, wherein the first liner and the second liner are each a thermal barrier layer.

17. The structure according to claim 14, wherein the first liner and the second liner are each an adhesion layer.

18. A method of forming a structure, the method comprising:
forming a first phase change material layer above a bottom electrode;
forming a dielectric layer above the first phase change material layer;
forming an inner electrode in the dielectric layer, wherein the inner electrode is the same material as the bottom electrode;
forming a second phase change material layer above the dielectric layer, wherein the inner electrode physically and electrically is connected to both the first phase change material layer and the second phase change material layer;
forming a top electrode above the second phase change material layer.

19. The method according to claim 18, further comprising:
providing a high voltage pulse to the dielectric layer to form the inner electrode, wherein
the dielectric layer comprises a dielectric constant greater than or equal to 5.0.

20. The method according to claim 18, further comprising:
resetting the structure to an amorphous stage by applying a current to the inner electrode.

21. The method according to claim 18, further comprising:
reading a memory state of the structure by applying a voltage between the bottom electrode and the top electrode.

* * * * *